(12) United States Patent
Lugiez

(10) Patent No.: US 9,124,223 B2
(45) Date of Patent: Sep. 1, 2015

(54) PREAMPLIFIER POLARISATION DEVICE

(71) Applicant: Commissariat à l' énergie atomique et aux énergies alternatives, Paris (FR)

(72) Inventor: Francis Lugiez, Bagneux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 234 days.

(21) Appl. No.: 13/856,150

(22) Filed: Apr. 3, 2013

(65) Prior Publication Data

US 2013/0257541 A1   Oct. 3, 2013

(30) Foreign Application Priority Data

Apr. 3, 2012   (FR) ...................... 12 53031

(51) Int. Cl.
*H03F 3/21*  (2006.01)
*H03F 3/68*  (2006.01)
*H03F 1/02*  (2006.01)

(52) U.S. Cl.
CPC .............. *H03F 3/211* (2013.01); *H03F 1/0205* (2013.01); *H03F 3/68* (2013.01)

(58) Field of Classification Search
USPC .............................. 330/124 R, 295, 127, 297
IPC ....................................................... H03F 1/0211
See application file for complete search history.

(56) References Cited

U.S. PATENT DOCUMENTS

| | | | | |
|---|---|---|---|---|
| 3,213,290 | A * | 10/1965 | Klein et al. | 377/38 |
| 4,430,582 | A | 2/1984 | Bose et al. | |
| 5,144,592 | A * | 9/1992 | Bonis | 367/87 |
| 5,262,982 | A * | 11/1993 | Brassington et al. | 365/145 |
| 7,489,198 | B1 * | 2/2009 | Cepas et al. | 330/297 |
| 7,598,821 | B2 * | 10/2009 | Novac | 331/160 |
| 8,542,061 | B2 * | 9/2013 | Levesque et al. | 330/127 |
| 2004/0100324 | A1 * | 5/2004 | Fryette | 330/127 |
| 2008/0129348 | A1 | 6/2008 | Shau | |
| 2014/0085008 | A1 * | 3/2014 | Cohen et al. | 330/297 |

FOREIGN PATENT DOCUMENTS

GB   2 340 684   2/2000

OTHER PUBLICATIONS

French Preliminary Research Report dated Jan. 18, 2013 for Appln No. FR 1253031.

* cited by examiner

*Primary Examiner* — Patricia T Nguyen
(74) *Attorney, Agent, or Firm* — Pillsbury Winthrop Shaw Pittman LLP

(57) ABSTRACT

An electronic device for reading at least two acquisition channels, the device including a preamplifier with an inverter for each acquisition channel, and a polarization device shared by at least two of the preamplifiers.

7 Claims, 4 Drawing Sheets

1st embodiment

2nd embodiment

PREAMPLIFIER POLARISATION DEVICE

CROSS REFERENCE TO RELATED APPLICATIONS

This application claims the benefit of priority from French Patent Application No. 1253031 filed on Apr. 3, 2012, the entire content of which is incorporated herein by reference.

FIELD

The technical field of the invention is that of multichannel integrated circuits, particularly in CMOS or BiCMOS technology, designed specifically to read sensors. The present invention relates to an electronic device for reading at least two acquisition channels.

BACKGROUND

In the standard internal arrangement of a microelectronic acquisition channel reader device, a preamplifier is located at the input to each acquisition channel associated with a sensor that emits an electrical signal. Preamplification enables the power of the electrical signals emitted by the sensors to be increased. As is shown in FIG. 1, a device LECT for reading N acquisition channels $C_1, C_2, \ldots C_N$ that are dedicated to reading N sensors $CAP_1, CAP_2, \ldots CAP_N$ is conventionally equipped with N preamplifiers $AMP_1, AMP_2, \ldots AMP_N$, which are all identical from one channel to the next. The input stage for each preamplifier is generally followed by a cascode stage CASC for increasing the open loop gain and increase the dynamic output.

A classic preamplifier comprises one active element, which is generally cascoded. FIG. 2 shows an example of a preamplifier comprising an active element $M_1$ the current of which is polarized by a current source delivering a current $I_{pol}$, followed by a cascade stage $M_2$ the voltage of which is polarized by a polarization voltage $V_{pol}$, the entire assembly being powered between a first voltage $V_{SS}$ and a second voltage $V_{DD}$. The signal to be preamplified is applied to active element $M_1$ at an input $E_0$ and exits this element at an output $S_0$ having been amplified.

However, a preamplifier based on a CMOS inverter offers certain benefits over a conventional preamplifier according to the preceding description, in particular its double transconductance capability for the same polarization current, which is advantageous in terms of noise: if the inverter is used, the equivalent input noise is reduced for the same polarization current.

Accordingly, CMOS inverter assemblies are used widely in logic circuits and for analogue applications. The main obstacle to using a CMOS inverter for analogue applications is the control of the polarization current, because unlike logic applications, in which the static polarization current is zero and the transistors are not activated except when a logic state changes, it is necessary to impress a readily controllable polarization current in order to set the transconductance of the PMOS transistor and the NMOS transistor in accordance with the speed and noise characteristics desired.

In analogue applications of such kind, this problem is solved by using a polarization device comprising a voltage regulator with an identical impressed current inverter for reference. Such a polarization device POL is described in a publication by Eric Vittoz: "CMOS et BiCMOS VLSI Design'91" and is represented in FIG. 3. The signal from a sensor CAP that is to be preamplified is applied to a CMOS-type inverter INV at an input $E_1$, and the amplified signal exits at output $S_1$. A voltage regulator REG of which the amplifier stage is installed in parallel with inverter INV is connected to a reference inverter INV_REF that is identical to inverter INV. A current source supplies the impressed current $I_{pol}$ that flows through this reference inverter INV_REF. Reference inverter INV_REF and voltage regulator REG are powered between a first voltage $V_{DD}$ and a second voltage $V_{SS}$. As a known current $I_{pol}$ is passed through reference inverter INV_REF, a reference voltage $V_{ref}$ is obtained at a point B, which is the junction point between reference inverter INV_REF and reference input of voltage regulator REG. If a regulated voltage equal to $V_{ref}$ is applied to inverter INV at a point A, which is the junction point between inverter INV and voltage regulator INV, a current equal to $I_{pol}$ may be impressed across inverter INV. Moreover, voltage regulator REG serves to ensure low impedance at point A in order to obtain good rejection of variations in supply voltage $V_{DD}$. Such regulation thus offers one solution for providing effective, stable control of the static polarization current of inverter INV.

The drawback of this solution is related to the unavoidable noise created by the integrated voltage regulator REG as opposed to an external voltage source. In fact, it might be possible to reduce the noise from an external voltage source with the aid of filters with high-value external capacitances, but this is not possible for the noise from an integrated circuit. One obvious solution for reducing the regulation noise is to increase the power that is dissipated into the amplifier element of voltage regulator REG, because if the polarization currents of the noisy active elements are increased, the equivalent input noise thereof is reduced.

The situation thus becomes paradoxical: in order to take advantage of a potential reduction in input noise offered by inverter INV for the same polarization current compared with a conventional preamplifier such as the one shown in FIG. 2, more power must be dissipated into voltage regulator REG.

The noise contributions of the structure that comprises inverter INV and voltage regulator REG, and the noise contributions of a conventional preamplifier constructed with an active element will be compared later in this document. FIG. 4 shows a simplified schematic diagram of FIG. 3 for determining the noise contribution of voltage regulator REG. The intrinsic noise of voltage regulator REG is represented by an equivalent noise source $V_b$, from which it emanates: $V_{ddINV} = V_b + V_{ref}$.

It should be noted that the noise contributed by reference inverter INV_REF is negligible since it is a simple matter to filter this noise either internally or using an external capacitance. The noise contribution of the reference inverter INV_REF is thus considered to be zero for the remainder of this description.

FIG. 5 shows a small-signal equivalent circuit of the assembly of FIG. 4. The capacitance of sensor CAP of which the signal is preamplified by inverter INV is notated $C_e$, the capacitances of the N-MOS and P-MOS transistors are notated $C_1$ and $C_2$ respectively, the transconductances of the N-MOS and P-MOS transistors are notated $g_{mINV}$ and the load is notated $Z_L$. $i_{d1}$ and $i_{d2}$ are the illustrations of the noises introduced by the N-MOS and the P-MOS in the form of current sources.

The noise introduced by voltage regulator REG that is referred to the input of inverter INV depends on the impedance of sensor CAP. In the case of a capacitive high impedance internal current source-type sensor CAP, for example a particle (photon, charged particle) detector, the contribution in terms of noise spectral density (in $V^2/Hz$) from voltage regulator REG is:

$$V_s = V_b Z_L g_{mINV} \frac{C_e + C_1 - C_2}{C_e + C_1 + C_2}$$

The equivalent input noise is:

$$V_e = \frac{V_s}{2Z_L g_{mINV}} = \frac{V_b}{2} \frac{C_e + C_1 - C_2}{C_e + C_1 + C_2} \text{ (since voltage gain is } 2Z_L g_{mINV}\text{)}.$$

Using realistic assumptions such as: $C_e \gg C_1$, $C_2$, one arrives at:

$$V_e = \frac{V_b^2}{4}$$

On the other hand, the noise attributable to inverter INV is $$V_{INV} = \frac{2kTy}{g_{mINV}}$$

(where $g_{mINV}$ is the transconductance of each transconductance of inverter INV) because the spectral density of the noise current of each transistor of inverter INV is $I_d^2 = 4 kTy g_{mINV}$.

On the other hand the noise referred to input that is attributable to a conventional preamplifier consisting of an active element ELT passed through by that same polarization current as inverter INV is:

$$V_{ELT} = \frac{4kTy}{g_{mINV}}$$

Therefore, in order to retain an advantage over a conventional preamplifier, the following condition must be satisfied:

$$\frac{V_b^2}{4} + \frac{2kTy}{g_{mINV}} \leq \frac{4kTy}{g_{mINV}}, \text{ or } \frac{V_b^2}{4} \leq \frac{2kTy}{g_{mINV}}.$$

Thus, $V_b^2 = \frac{4kTy}{g_{mREG}}$ since $g_{mREG}$ is the transconductance of the active elements that constitute the amplifying element of voltage regulator REG.

Therefore, in order to retain an advantage over a conventional preamplifier, the condition that must be satisfied is:

$$g_{mINV} \leq 2 \cdot g_{Mreg}.$$

The current in the amplifier element of the regulator must therefore be at least equal to that of the inverter in order to satisfy this condition in the typical situation in which said amplifier is based on a differential pair.

It follows that in order to ensure a noise performance at least equal to that obtained with a conventional preamplifier that uses an active element, the use of an inverter assembly with integrated regulation results in a doubling of the dissipated current, that is to say the dissipated power. This represents not an improvement but a worsening of energy efficiency, and the signal-to-noise ratio obtained for a given power is less than that obtained using a conventional preamplifier.

SUMMARY

An aspect of the invention suggests a solution for polarizing or regulating inverter-based preamplifiers in an electronic acquisition channel reading device, while minimising the impact thereof on the signal-to-noise ratio in the context of analogue applications.

According to a first aspect, the invention relates essentially to an electronic device for reading at least two acquisition channels, wherein the device comprises a preamplifier with an inverter for each acquisition channel, the device further comprising a polarization device shared by at least two of the preamplifiers.

An embodiment of the invention is usable in logic or analogue applications, but is particularly beneficial for analogue applications. In fact, in the case of analogue applications, the device according to an embodiment of the invention renders the regulation less noisy because the polarization device is used in common by multiple preamplifiers, so that the noise it contributes to a channel is reduced thereby.

An embodiment of the invention is particularly designed for power preamps, which will be described in the following. Power preamps are in fact used widely for analogue applications.

Besides the main features described in the preceding paragraph, the device according to an embodiment of the invention may also include one or more additional features from the following, taken either individually or in any technically possible combination thereof:

- the polarization device comprises a voltage regulator and a reference inverter, the reference inverter being identical to the inverters of the preamplifiers. This is a simple way to regulate both the voltage and the current of the inverter-based preamplifiers at the same time.
- the polarization device is connected in parallel with the preamplifiers. In this way, the polarization device is able to draw a current that is sufficient to reduce its own noise.
- the polarization device is shared by at least six preamplifiers. This is the condition in which it is most beneficial in terms of dissipated power and the signal-to-noise ratio to use inverter-based preamplifiers that are polarized via the polarization device rather than conventional preamplifiers.
- the voltage regulator is connected in series with the assembly that includes the preamplifiers. Thus, there is no shunt current in the voltage regulator, and accordingly no increase in dissipated power, and the current available in the amplifier element of the regulator can be equal to the sum of the preamplifier polarization currents, reducing the noise from this regulator correspondingly.
- the inverters are based on CMOS technology. The benefits of CMOS technology are known: low manufacturing cost, high integration density, access to integrated logic functions in order to create mixed analogue/digital circuits.
- the inverters are produced with the aid of additional bipolar transistors based on BiCMOS technology. The benefits of BiCMOS technology are known: they combine the benefits of CMOS technology with those of bipolar technology, and are suitable for creating fast circuits.

The invention and various applications thereof will be better understood upon reading the following description and reviewing the accompanying figures.

BRIEF DESCRIPTION OF THE FIGURES

The figures are provided purely for illustrative purposes and are not intended to be limiting of the invention in any way.

The figures show.

DETAILED DESCRIPTION

Figure 6:
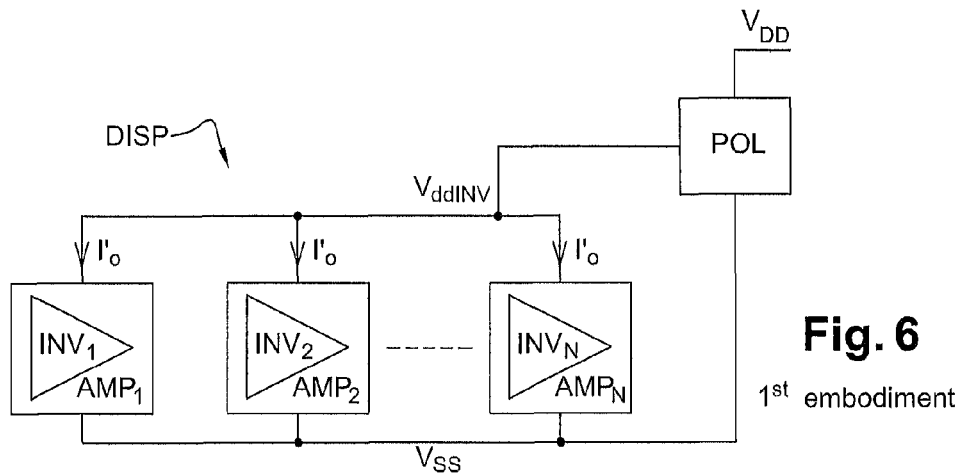
FIG. 6 shows a polarization device for a plurality of inverter-based preamplifiers belonging to an acquisition channel reader device according to a first embodiment of the invention.

A part of a device DISP for reading N acquisition channels according to a first embodiment of the invention is shown in FIG. 6. Reading device DISP comprises:

N preamplifiers AMP1, each preamplifier AMP being connected to the output of a sensor—not shown—and to the input of an acquisition channel—not shown. One preamplifier AMP1 thus corresponds to one sensor and one acquisition channel. Each preamplifier AMP1 comprises one inverter INV1.

Figure 1:
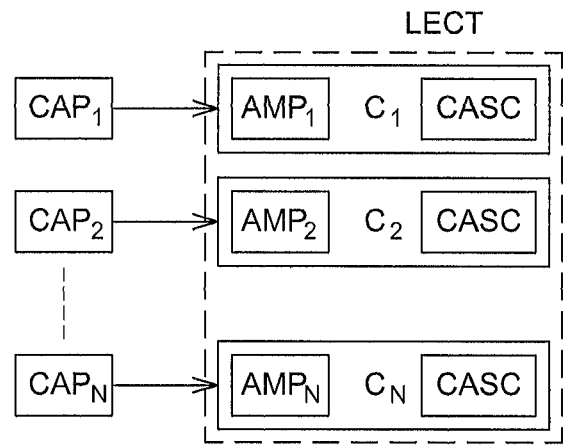
FIG. 1, described previously, shows an acquisition channel reading device.
Figure 2:
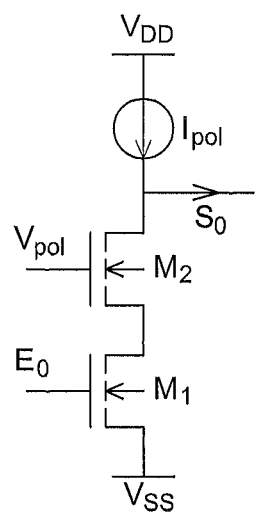
FIG. 2, described previously, shows a conventional preamplifier comprising an active element.
Figure 3:
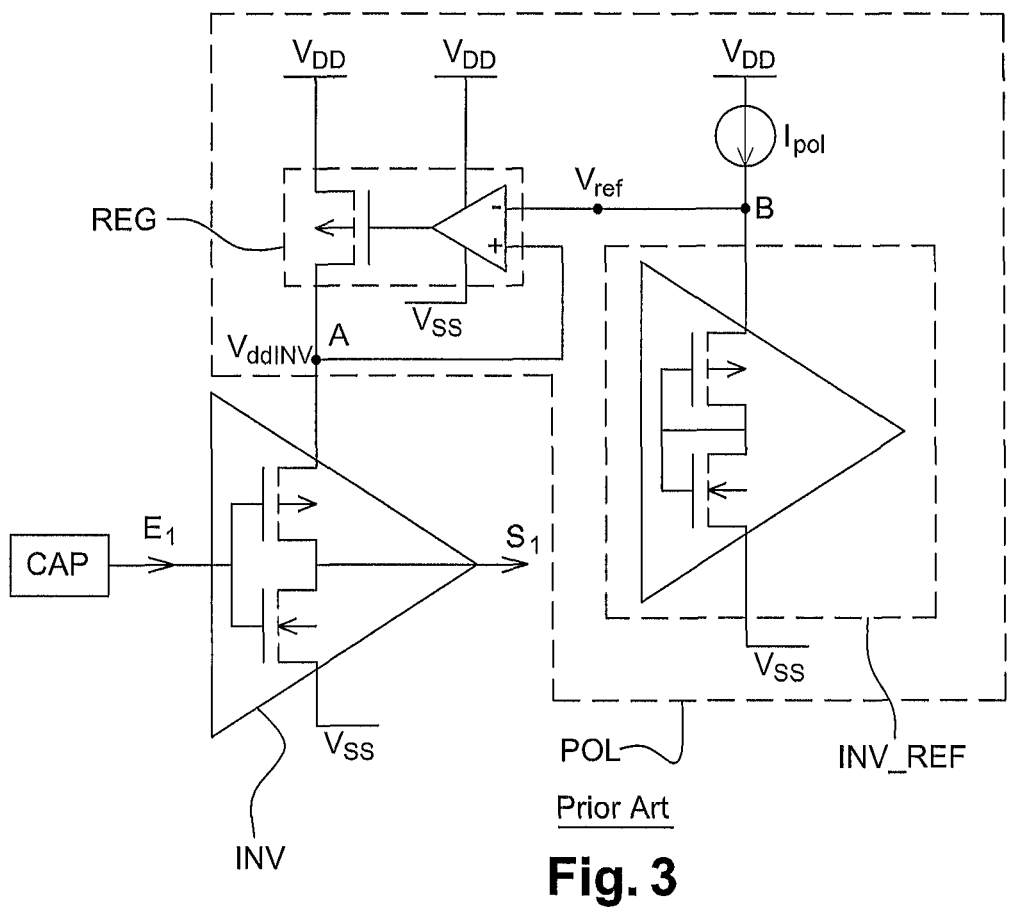
FIG. 3, described previously, shows a regulator device for a CMOS inverter-based preamplifier.
Figure 4:
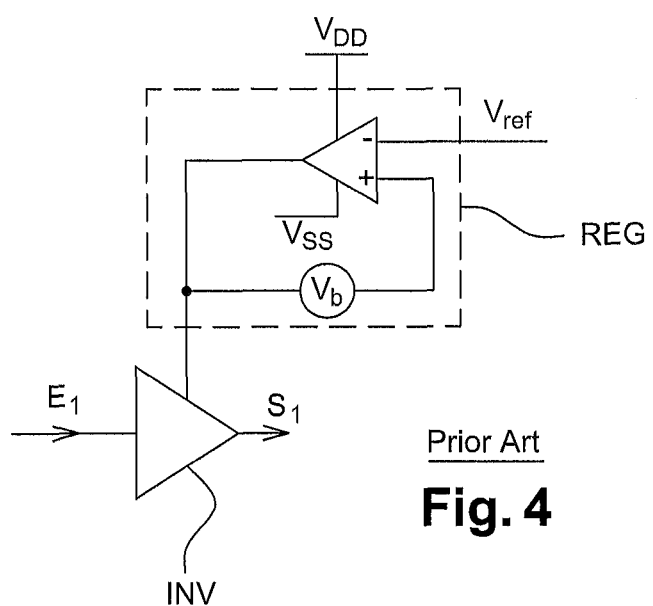
FIG. 4, described previously, is a simplified schematic diagram of FIG. 3.
Figure 5:
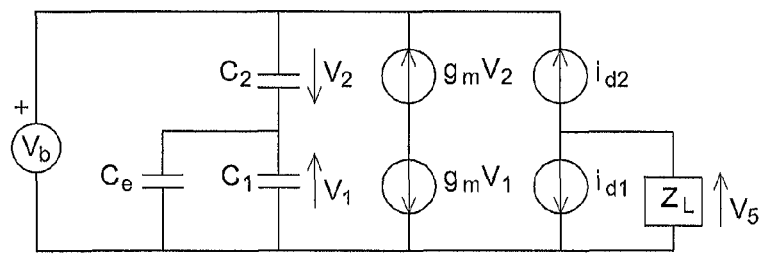
FIG. 5, described previously, shows a small-signal equivalent circuit of the installation of FIG. 4.

A polarization device POL such as has been described in the preceding and is illustrated in FIG. 3, comprising:
a voltage regulator REG
a reference inverter INV
a current source Ipol.

In this first embodiment, voltage regulator REG and reference inverter INV_REF are powered between a first voltage $V_{DD}$ and a second voltage $V_{SS}$. The voltage applied to preamplifiers $AMP_i$ due to the polarization device is $V_{ddINV}$, as explained previously. It should be noted in that in this first embodiment, polarization device POL is connected to preamplifiers $AMP_i$ in parallel.

Based on the calculations explained previously that enable a conventional preamplifier to be compared with an inverter-based amplifier assembly with regulator, in a following a generalization is made of the assembly of N inverters $INV_i$ associated with a single polarization device POL, retaining the same power allocated per channel $P_0$.

In the expressions that follow, the notation $g_m(I)$ means that the transconductance $g_m$ of a transistor is a function of the polarization current I that flows through it.

For a conventional preamplifier:
the dissipated power is P0, corresponding to a polarization current I0. This is represented by $P_0=I_0 \cdot (V_{DD}-V_{SS})$.
the noise spectral density referred to input is equal to $$\frac{4kTy}{g_m(I_0)}.$$

For the N preamplifiers $AMP_i$ based on inverters $INV_i$ with polarization device POL:
the dissipated power is: $NP_0=NP_0'+D_{REG}$, with $P_0'=I_0' \cdot (V_{DD}-V_{SS})$, $I_0'$ being the polarization current that passes through a preamplifier $AMP_i$ and $P_{REG}=I_{REG} \cdot (V_{DD}-V_{SS})$ being the power consumed by the amplifier element of voltage regulator REG;
the noise spectral density referred to input is equal to:

$$\frac{2kTy}{g_m(I_0')} + \frac{V_b^2}{4} = \frac{2kTy}{g_m(I_0')} + \frac{kTy}{g_m\left(\frac{I_{REG}}{2}\right)}$$

since the amplifier element of voltage regulator REG is a differential amplifier, the available current per active element is $$\frac{I_{REG}}{2}.$$

It should be noted that the noise contribution by reference inverter INV_REF is thus considered to be zero for the reasons given earlier.

Therefore, in order to retain a benefit over a conventional preamplifier, the following condition should be satisfied:

$$\frac{2kTy}{g_m(I_0')} + \frac{kTy}{g_m\left(\frac{I_{REG}}{2}\right)} \leq \frac{4kTy}{g_m(I_0)}, \text{ or } \frac{2}{g_m(I_0')} + \frac{1}{g_m\left(\frac{I_{REG}}{2}\right)} \leq \frac{4}{g_m(I_0)}$$

In the case of bipolar transistors or weak inversion MOS transistors, this inequation can be resolved analytically since transconductances $g_m$ are proportional to the currents and thus also to the powers. Bearing in mind the fact that $N \cdot I_0 = NI_0' + I_{REG}$, since it is not desirable to dissipate more power the condition becomes:

$$\frac{2I_0'}{I_0} + \frac{I_0}{I_0'} \leq 3 - \frac{1}{N} \text{ with } \frac{I_0}{I_0'} > 1,$$

where I0 is the current that passes through a conventional amplifier and $I_0'$ is the current that passes through a preamplifier $AMP_i$ based on an inverter $INV_i$.

Quantity $$\frac{2I_0'}{I_0} + \frac{I_0}{I_0'}$$

is lowest when $$\frac{I_0}{I_0'} = \sqrt{2}.$$

For this value $$\frac{I_0}{I'_0} = \sqrt{2},$$

one then obtains the smallest value for N that satisfies the inequation, which is resolved to N≥6. The inverter noise is then effectively equal to 84% of the noise of the conventional preamplifier with the same apparent consumption. The limit value for noise retaining the same apparent consumption per channel when N increases is $$71\% \left(\frac{1}{\sqrt{2}}\right).$$

If one wishes to limit the power while retaining the same noise with a conventional architecture, one obtains a gain of 50% on the power consumed.

Figure 7:
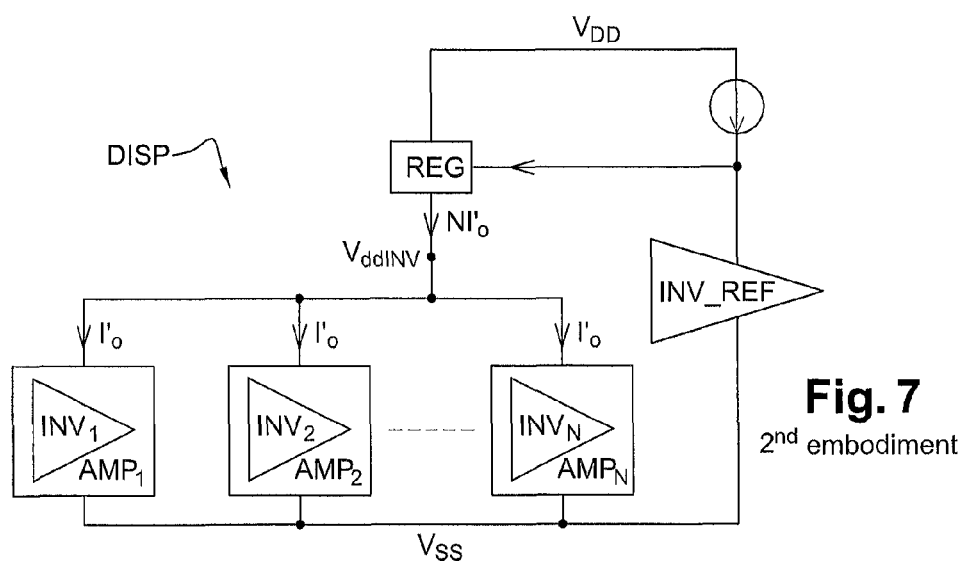
FIG. 7 shows a polarization device for a plurality of inverter-based preamplifiers belonging to an acquisition channel reader device according to a second embodiment of the invention.

In a second embodiment shown in FIG. 7, if reference inverter INV_REF is always powered between first voltage $V_{DD}$ and second voltage $V_{SS}$, voltage regulator REG is powered between first voltage $V_{DD}$ and voltage $V_{ddINV}$. Thus, voltage regulator REG is powered in series with preamplifiers AMR, so there is no shunt current in voltage regulator REG. The shunt current in reference inverter INV_REF is so weak as to be negligible. The available current in voltage regulator REG is then very weak, N·$I_0'$.

For equal current, the inverter-based circuit noise described compared with the conventional architecture is:

$$\frac{V_b(INV)}{V_b(\text{classique})} = \frac{\sqrt{1+\frac{1}{N}}}{\sqrt{2}},$$

which tends rapidly towards $$70\% \left(\frac{1}{\sqrt{2}}\right),$$

and the improvement in such a device compared with a conventional preamplifier is immediate with effect from N=2.

The invention therefore suggests a solution for polarizing inverter-based preamplifiers within an electronic device for reading acquisition channels without worsening the signal-to-noise ratio. The same signal-to-noise ratio may be obtained for a power consumption equal to 50% of that of the conventional architecture.

Figure 8:
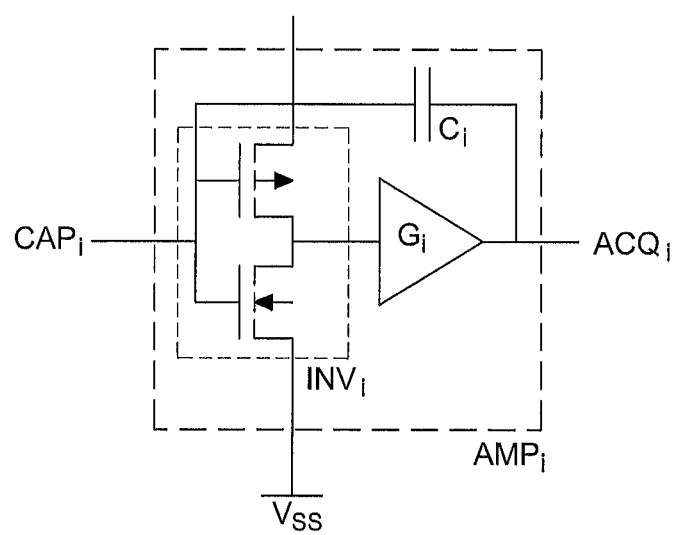
FIG. 8 shows a power preamp according to an embodiment of the invention.

In an embodiment, the N preamplifiers $AMP_i$ are power preamps, well known to a person skilled in the art. As is shown in FIG. 8, a power preamp $AMP_i$ includes a first gain stage consisting of an inverter $INV_i$ a second gain stage $G_i$ and a memory capacitor $C_i$.

The invention claimed is:

1. An electronic device for reading at least two acquisition channels, the device comprising a preamplifier with an inverter for each acquisition channel, and a polarization device shared by at least two of the preamplifiers, wherein the polarization device comprises a voltage regulator and a reference inverter, said reference inverter being identical to the inverters of the preamplifiers.

2. The device according to claim 1, wherein the polarization device is connected in parallel with the preamplifiers.

3. The device according to claim 1, wherein the polarization device is shared by at least six preamplifiers.

4. The device according to claim 1, wherein the voltage regulator is connected in series with the assembly comprising the preamplifiers.

5. The device according to claim 1, wherein the inverters are based on CMOS technology.

6. The device according to claim 1, wherein the inverters are produced on the basis of BiCMOS technology.

7. The device according to claim 1, wherein the preamplifiers are power preamps.

* * * * *